(12) United States Patent
Chung et al.

(10) Patent No.: US 8,728,959 B2
(45) Date of Patent: May 20, 2014

(54) TEXTILE DIGITAL BAND AND FABRICATING METHOD THEREOF

(75) Inventors: Gi Soo Chung, Gyeonggi-do (KR); Dae Hoon Lee, Gyeonggi-do (KR); Jae Sang An, Gyeonggi-do (KR)

(73) Assignee: Korea Institute of Industrial Technology, Chungcheongnam-do (KR)

( * ) Notice: Subject to any disclaimer, the term of this patent is extended or adjusted under 35 U.S.C. 154(b) by 252 days.

(21) Appl. No.: 12/531,676

(22) PCT Filed: Jun. 27, 2008

(86) PCT No.: PCT/KR2008/003723
§ 371 (c)(1),
(2), (4) Date: Sep. 16, 2009

(87) PCT Pub. No.: WO2009/107905
PCT Pub. Date: Sep. 3, 2009

(65) Prior Publication Data
US 2011/0130060 A1    Jun. 2, 2011

(30) Foreign Application Priority Data
Feb. 26, 2008  (KR) ................ 10-2008-0017484

(51) Int. Cl.
  *D03D 15/00*  (2006.01)
  *D02G 3/00*  (2006.01)
  *H05K 9/00*  (2006.01)
  *H05B 3/00*  (2006.01)

(52) U.S. Cl.
  USPC .......... 442/189; 442/301; 428/380; 428/381; 428/383; 174/36; 174/350; 174/352; 219/201; 219/211; 219/212; 219/217

(58) Field of Classification Search
  USPC ............. 57/210; 174/32–36, 350, 352; 442/181–319; 428/375, 376–383
  See application file for complete search history.

(56) References Cited

U.S. PATENT DOCUMENTS

| | | | | | |
|---|---|---|---|---|---|
| 3,699,768 | A | * | 10/1972 | Roberts et al. | 57/213 |
| 4,793,130 | A | * | 12/1988 | Togashi et al. | 57/210 |
| 5,473,113 | A | * | 12/1995 | Aldissi | 174/36 |
| 6,246,006 | B1 | * | 6/2001 | Hardin et al. | 174/106 R |
| 6,534,175 | B1 | * | 3/2003 | Zhu et al. | 428/365 |
| 2003/0211797 | A1 | * | 11/2003 | Hill et al. | 442/205 |

(Continued)

FOREIGN PATENT DOCUMENTS

| CN | 1592938 A | 3/2005 |
|---|---|---|
| CN | 2824250 Y | 10/2006 |

(Continued)

OTHER PUBLICATIONS

Warp, Textile Glossary, copyright 2001, Celanese Acetate.*

*Primary Examiner* — Jennifer A Steele

(57) ABSTRACT

The present invention relates to a textile digital band which is capable of providing a high-speed communication path with surrounding computing devices, through easy and convenient attachment thereof to a conventional garment, and a fabrication method thereof. For this purpose, disclosed herein is a textile digital band comprising a plurality of warps formed parallel to each other in the first direction, and a plurality of wefts formed parallel to each other in the second direction perpendicular to the first direction, wherein the warp includes at least one digital yarn through which electrical currents can flow.

9 Claims, 5 Drawing Sheets

(56) References Cited

U.S. PATENT DOCUMENTS

2004/0194996 A1* 10/2004 Ysbrand ................. 174/102 SC
2005/0029006 A1*  2/2005 Takahashi et al. ........ 174/102 R
2006/0281382 A1   12/2006 Karayianni et al.
2009/0050362 A1*  2/2009 Burke et al. .................. 174/388

FOREIGN PATENT DOCUMENTS

| JP | 11-040329 | 2/1999 |
| JP | 2007-220616 | 8/2007 |
| WO | WO 00/56966 | 9/2000 |
| WO | WO 2007/094563 A1 | 8/2007 |

* cited by examiner

TEXTILE DIGITAL BAND AND FABRICATING METHOD THEREOF

This application claims the priority of Korean Patent Application No. 10-2008-0017484, filed on Feb. 26, 2008 in the KIPO (Korean Intellectual Property Office), the disclosure of which is incorporated herein entirely by reference. Further, this application is the National Stage application of International Application No. PCT/KR2008/003723, filed Jun. 27, 2008, which designates the United States and was published in English. Each of these applications is hereby incorporated by reference in their entirety into the present application.

TECHNICAL FIELD

This work was supported by the IT R&D program of MIC/IITA. [2006-S-029-02, Design and Development of Woven UFC (Ubiquitous Fashionable Computer) Technology]

The present invention relates to a textile digital band and a fabrication method thereof. More specifically, the present invention relates to a textile digital band which is capable of providing a high-speed communication path with surrounding computing devices, through easy and convenient attachment thereof to a conventional garment, and a fabrication method thereof.

BACKGROUND ART

With the advent of the ubiquitous era, there is a strong demand among people for gathering and exchange of various information through real-time network access irrespective of when and where it is conducted. As an approach to follow the trend of the world as above, a human-wearing digital garment is required to perform such a function through access to the surrounding network. For this purpose, digital yarn is used as yarn through which migration of electrons can take place for transmission of information and which is weavable or knittable into desired products including garments.

Meanwhile, such digital yarn should be attached to a connector on a one by one basis, so fabrication of a digital garment using the digital yarn undesirably suffers from a prolonged process time. Further, when it is desired to make the garment using the digital yarn fabric, an additional step of connecting the digital yarn is required at seams of the garment, thus resulting in a complicated process of garment tailoring. Further, when it is desired to attach the digital yarn to a conventional garment, a process for re-processing the digital yarn is inevitably necessary, which still leads to the complexity of the garment making.

DISCLOSURE

Technical Problem

Therefore, the present invention has been made in view of the above problems, and it is an object of the present invention to provide a textile digital band which is capable of offering a high-speed communication path with the surrounding computing devices, through easy and convenient attachment thereof to a conventional garment, and a fabrication method thereof.

Technical Solution

In accordance with an aspect of the present invention, the above and other objects can be accomplished by the provision of a textile digital band comprising a plurality of warps formed parallel to each other in the first direction and a plurality of wefts formed parallel to each other in the second direction perpendicular to the first direction, wherein the warp includes at least one digital yarn through which electrical currents can flow.

The digital yarns may be disposed inside edges of the warps.

The warps include a plurality of common warps formed parallel to each other in the first direction and consisting of single yarns or ply yarns, and the digital yarns formed between the common warps.

Further, the digital yarn may include at least one metal part positioned at the center of the digital yarn based on a diameter thereof and providing a communication path, and a coating portion formed surrounding the metal part and shielding electromagnetic waves.

Further, the digital yarn may further include a plurality of cover yarns formed surrounding the coating portion.

Further, the metal part may be formed of at least one selected from the group consisting of copper, copper alloy, silver, silver alloy, gold, gold alloy, brass and any combination thereof.

Further, the metal part may include a first metal part positioned at the center of the metal part based on a diameter thereof and formed along the first direction, and a second metal part formed surrounding the outside of the first metal part.

Further, the first metal part and the second metal part may be formed of different materials.

Further, the outside of the second metal part may be further provided with a third metal part formed surrounding the second metal part.

Further, the third metal part may be formed of a metal material different from that of the second metal part.

Further, the digital yarn may further include an outer metal part arranged along an outer periphery of the coating portion and an outer coating portion formed surrounding the outer metal part.

Further, the outer metal part may be arranged at equal spacing.

In accordance with another aspect of the present invention, there is provided a method for fabricating a textile digital band, comprising:

providing digital yarns including at least one metal part and a coating portion surrounding the metal part (step of providing digital yarns);

arranging a plurality of warps including the digital yarns parallel to each other in the first direction (step of arranging warps); and letting-off wefts in the second direction perpendicular to the first direction, such that the wefts intersect between the warps (step of letting-off wefts).

The step of providing the digital yarns may be carried out in a manner that the digital yarn further includes a plurality of cover yarns formed surrounding the coating portion.

Further, the step of providing the digital yarns may be carried out in a manner that the digital yarn further includes a plurality of outer metal parts arranged at equal spacing and surrounding along an outer periphery of the coating portion, and an outer coating portion surrounding the outer metal parts.

Further, the step of providing the digital yarns may be carried out in a manner that the metal part includes a first metal part formed at the center of the metal part based on a diameter thereof and a second metal part formed surrounding the first metal part, and the first metal part and the second metal part may be formed of different materials.

Further, the step of providing the digital yarns may be carried out in a manner that the metal part is further provided with a third metal part surrounding the second metal part, and the second metal part and the third metal part is formed of different materials.

Further, the step of arranging the warps may be carried out in a manner that
the warp includes a common warp consisting of single yarn or ply yarn, and digital yarn.

Further, the step of arranging the warps may be carried out in a manner that the common warp and the digital yarn are arranged such that the common warp is positioned at the outermost side portion of the warp.

Further, the step of arranging the warps may be carried out in a manner that the common warp consists of single yarn or ply yarn.

The warp step of letting-off wefts may be carried out in a manner that the weft is let-off in the form of single yarn or ply yarn.

Further, the step of letting-off wefts may be carried out in a manner that wefts intersect in a zigzag manner between the warps, based on a plane which is defined by warps in the first direction.

Further, the step of letting-off wefts may be carried out in a manner that the wefts are composed of a first weft and a second weft adjacent to each other, and the second weft intersects between the warps, in a reverse direction relative to the first weft.

Further, the step of letting-off wefts may be carried out in a manner that the first weft and the second weft intersect between the warps.

Advantageous Effects

As illustrated hereinbefore, a textile digital band in accordance with the present invention and its fabrication method include formation of the digital band using digital yarns. For this purpose, the digital band is formed by incorporation of the digital yarns as a part of the warps of the textile, and disposition of common warps on both edges of the textile. Then, both edges of the digital band may be sewed for easy attachment of the digital band to a conventional garment and formation of a communication path with the surrounding network.

NUMERAL DESCRIPTION OF THE MAJOR PORTION OF DRAWINGS

1000; Textile digital band in accordance with one embodiment of present invention

| | |
|---|---|
| 100; warps | 110; common warps |
| 120, 120'; digital yarn | 121; metal part |
| 121a; first metal part | 121b; second metal part |
| 121c; third metal part | 122; coating portion |
| 123; void | 121'; outer metal parts |
| 122'; outer coating portion | 123'; void |
| 200; wefts | 210, 220; common wefts |
| 300; void | |

MODE FOR INVENTION

Now, preferred embodiments of the present invention will be described in more detail with reference to the accompanying drawings, such that those skilled in the art can easily practice the present invention.

Hereinafter, a textile digital band 1000 in accordance with one embodiment of the present invention will be illustrated.

Figure 1:
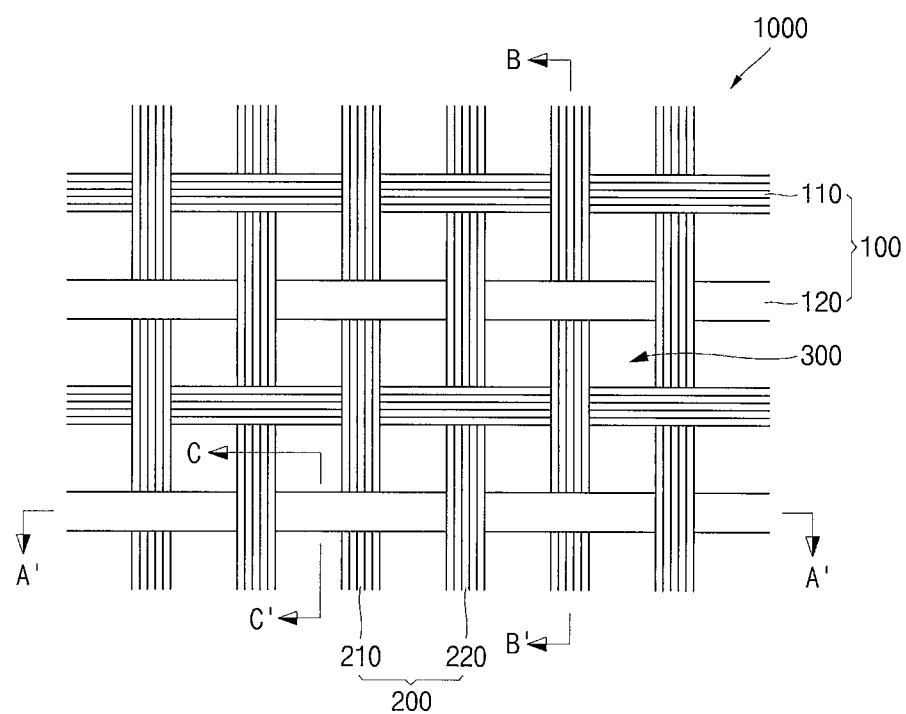
FIG. 1 is a plan view of a textile digital band in accordance with one embodiment of the present invention.
Figure 2:
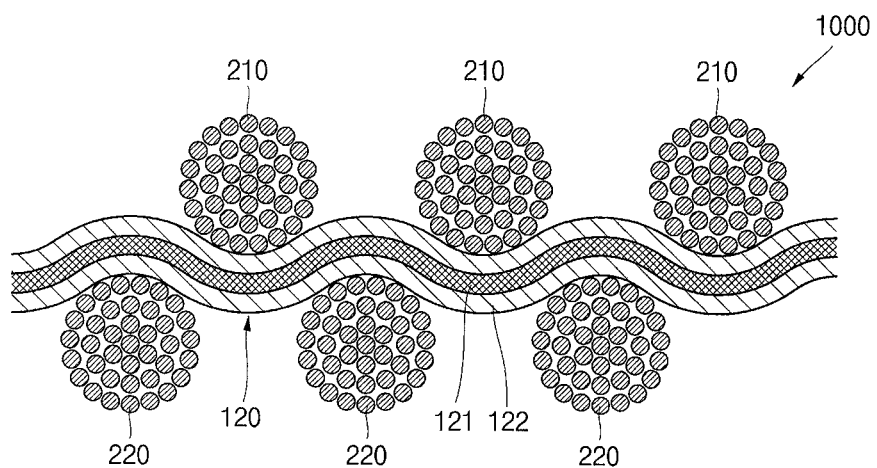
FIG. 2 is a cross-sectional view taken along line A-A' of FIG. 1.
Figure 3:
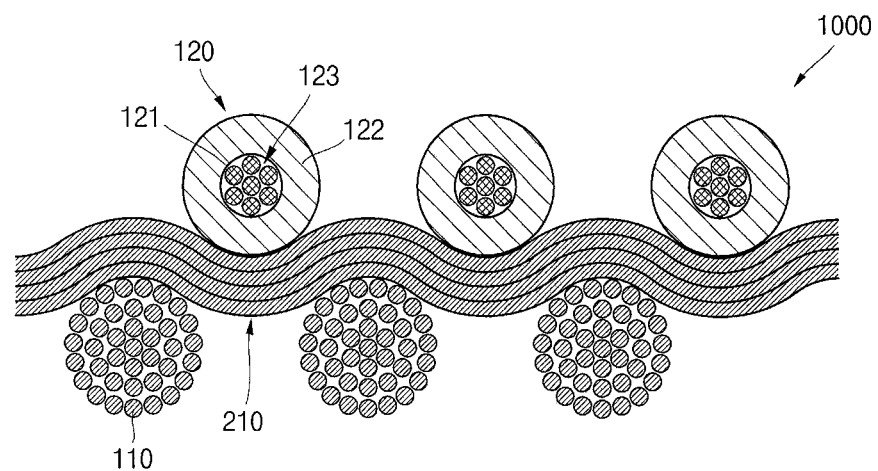
FIG. 3 is a cross-sectional view taken along line B-B' of FIG. 1.
Figure 4:
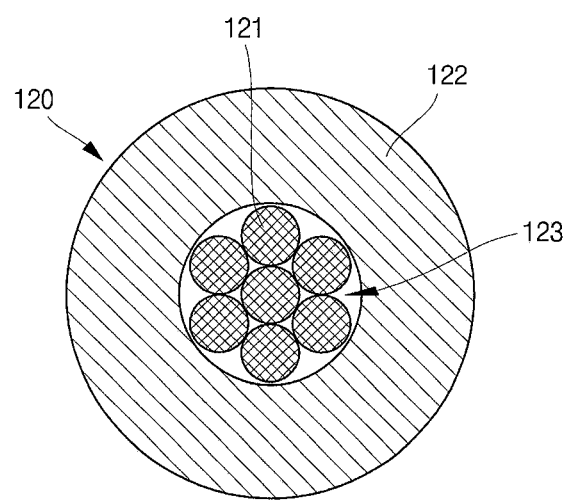
FIGS. 4 and 5 are enlarged cross-sectional views of digital yarn used in a textile digital band in accordance with one embodiment of the present invention.
Figure 5:
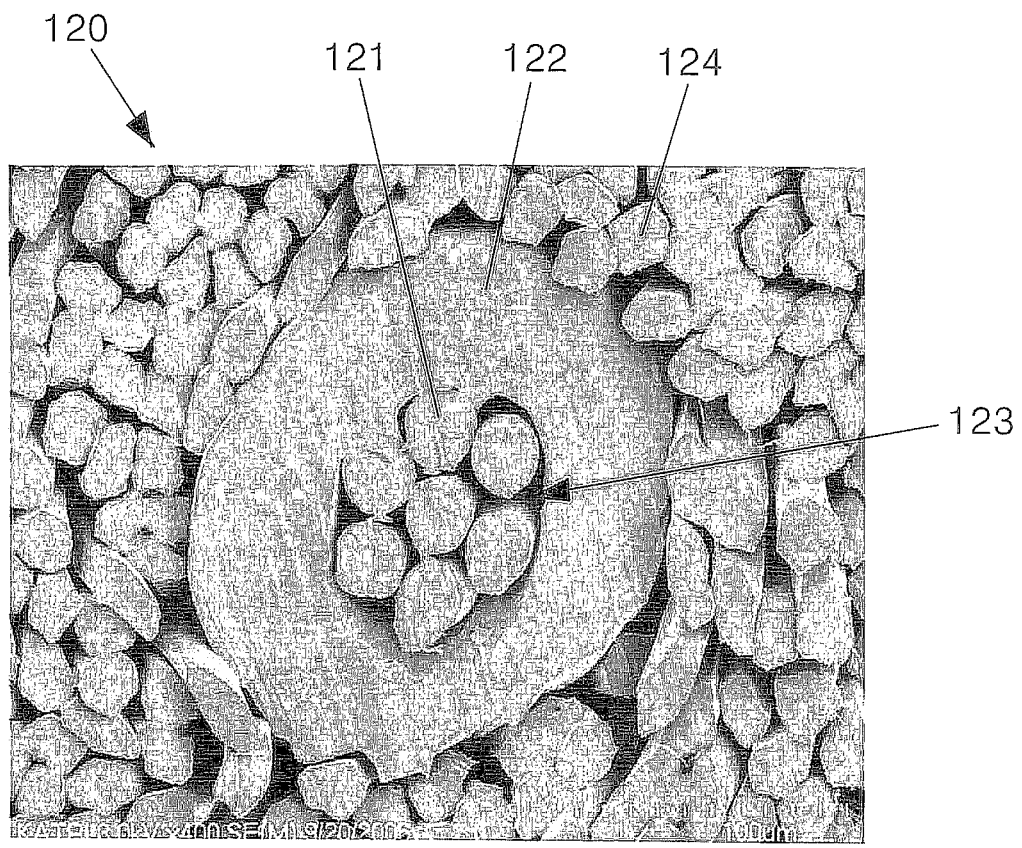
Figure 6:
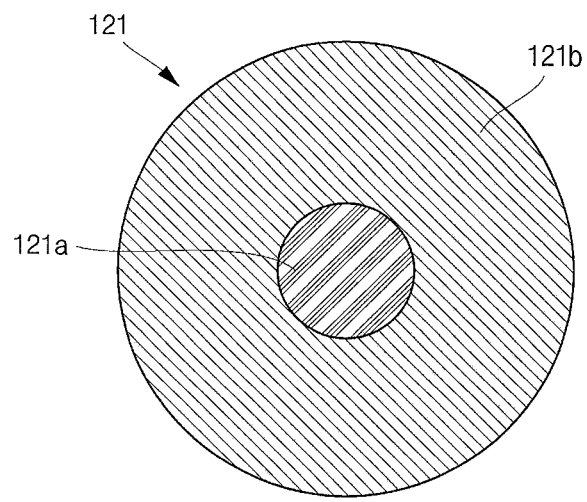
FIG. 6 and FIG. 7 are enlarged cross-sectional views of a metal part used in a textile digital band in accordance with one embodiment of the present invention.
Figure 7:
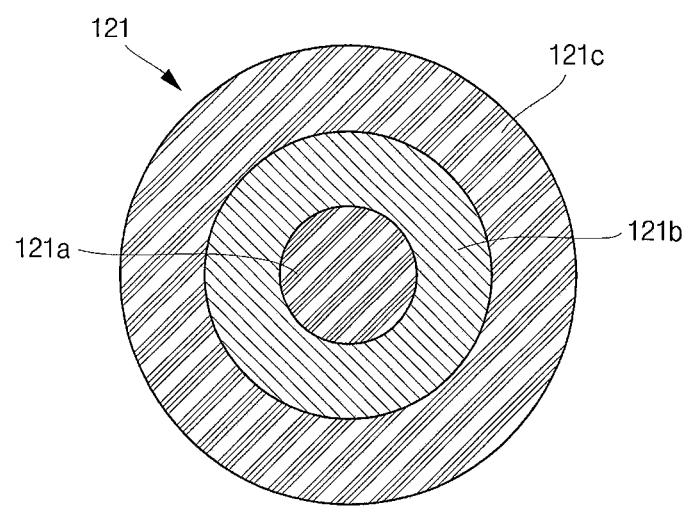

FIG. 1 is a plan view of a textile digital band 1000 in accordance with one embodiment of the present invention. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1. FIGS. 4 and 5 are enlarged cross-sectional views of digital yarn 120 used in a textile digital band 1000 in accordance with one embodiment of the present invention. FIG. 6 and FIG. 7 are enlarged cross-sectional views of a metal part 121 used in digital yarn 120 of the present invention.

Referring to FIG. 1 through FIG. 7, the textile digital band 1000 in accordance with one embodiment of the present invention may include a plurality of warps 100 arranged parallel to each other in the first direction, and a plurality of wefts 200 arranged perpendicularly to the warps 100. Further, the intersection of the warps 100 and the wefts 200 may result in the formation of voids 300 inside two lines of warps 100 and two rows of wefts 200.

The warps 100 are arranged parallel to each other in the first direction and are multiply arranged at regular spacing in the second direction perpendicular to the first direction. As used herein, the term "first direction" refers to a lengthwise direction of the textile digital band 1000 in accordance with one embodiment of the present invention. The warps 100 are comprised of a plurality of common warps 110 and digital yarns 120 arranged in the second direction.

The common warps 110 are formed using yarn. As used herein, the term "yarn" refers to a thread that forms a textile for weaving or knitting of the garment. Further, FIGS. 1 to 4 show the common warp 110 in the form of multi-ply yarn structure. The structure of the common warp 110 is not limited to the ply yarn form, so the common warp 110 may also be in the form of single yarn. As used herein, the term "single yarn" refers to one strand of yarn, and the term "ply yarn" refers to an assembly of two or more single yarns twisted together in a direction opposite to that in its component single yarns.

The common warps 110 are positioned on edges of the second direction within the textile digital band 1000 in accordance with one embodiment of the present invention. Thereafter, the textile digital band 1000 is sewed to the garment to form a digital garment. Here, edges of the textile digital band 1000 are sewed. That is, disposition of the common warps 110 on edges of the textile digital band 1000 results in sewing of the common warps 110 upon attachment of the band 1000 to the garment, which consequently prevents possible damage to the digital yarn 120 which will provide a communication path, occurring when it is sewed.

The digital yarn 120 is provided in the form of at least one yarn. Further, the digital yarn 120 is formed in the first direction and arranged parallel to the common warp 110. The digital yarn 120 provides a communication path with the surrounding computing device, when the textile digital band 1000 is attached to the garment.

The digital yarn 120 includes at least one generally circular cast metal part 121, and a generally circular coating portion 122 formed by covering the metal part 121 with a resin material. Further, between the metal part 121 and the coating portion 122 may be provided vacant spaces, i.e. voids 123, which were formed due to the failure of flow of the coating portion 122 into the region between the metal parts 121. The digital yarn 120 may be further provided with cover yarn 124 surrounding an outer periphery of the coating portion 122.

The metal part 121 is formed of a metal which has low electrical resistance and high resilience against repeated bending. The metal part 121 may be formed of at least one selected from the group consisting of copper, copper alloy, silver, silver alloy, gold, gold alloy, brass and any combination thereof. Further, even though the metal part 121 is shown to be composed of seven members, the present invention is not limited thereto.

Referring to FIG. 6, the metal part 121 may include a generally circular first metal part 121a and a second metal part 121b surrounding the first metal part 121a and formed of a different material than the first metal part 121a. The first metal part 121a may be formed of copper, copper alloy, brass or an equivalent thereof which has low electrical resistance and high resilience against repeated bending. Further, when it is intended for high speed communication, the second metal part 121b may be formed of silver, silver alloy or an equivalent thereof, which has relatively excellent conductivity, taking into consideration skin effects.

Referring to FIG. 7, an outer periphery of the second metal part 121b may be further provided with a generally circular third metal part 121c surrounding the second metal part 121b and formed of another material among the above-exemplified materials. When it is contemplated for high speed communication, the third metal part 121c may be formed of gold, gold alloy or an equivalent thereof which has relatively excellent conductivity.

The coating portion 122 serves to prevent penetration of electromagnetic waves, generated when the textile digital band 1000 is used for high speed communication, into the human body and also serves to block penetration of external noise into the metal part 110. For this purpose, the coating portion 122 may be formed of a polyurethane or Teflon material. Specifically, examples of the material for the coating portion 122 may include ethylenetetrafluoroethylene (ETFE), fluorinated ethylene propylene (FEP), polytetrafluoroethylene (PTFE), polyvinylidene fluoride (PVDF), perfluoroalkoxy (PFA) and functional equivalents thereof. It is to be understood that the present invention is not limited to the aforementioned materials for the coating portion 112.

A plurality of the cover yarns 124 may be formed surrounding an outer periphery of the coating portion 122. The cover yarn 124 may be formed using the same yarn as in formation of the common warp 110. The cover yarn 124 is provided to form the periphery of the digital yarn 120, thereby protecting the metal part 121 and the coating portion 122 inside the digital yarn 120. That is, the cover yarn 124 buffers impact applied when the digital yarn 120 undergoes repeated bending, which consequently prevents breakage of the internal metal part 121 and coating portion 122.

The wefts 200 are formed perpendicularly to the warps 100 and parallel to each other in the second direction. Further, the wefts 200 are plurally arranged parallel to each other at regular spacing in the first direction. The wefts 200 are woven together with the warps 100 to thereby form a textile digital band 1000 in accordance with one embodiment of the present invention. The weft 200 may be formed to have a single yarn or ply yarn structure, similar to the common warp 110.

The weft 200 is composed of two groups, a first weft 210 and a second weft 220, depending on the rows where they are arranged. The first weft 210 and the second weft 220 are arranged neighboring to each other. For example, the first wefts 210 are positioned in odd-numbered rows, whereas the second wefts 220 are positioned in even-numbered rows.

The first wefts 210 perpendicularly intersect with the warps 100. The first wefts 210 are formed in the second direction such that they pass through the spaces formed by the warps 100 arranged parallel to each other. That is, the first wefts 210 are formed in a zigzag manner intersecting lower and upper parts of the plane defined by the warps 100.

The second weft 220 is formed in the second direction while being adjacent to the first weft 210. Even though the second weft 220 is also formed to pass through individual spaces defined between the warps 110, the passing direction is in reverse with respect to that of the first weft 210. Therefore, the second weft 220 together with the first weft 210 applies a given pressure to the lower and upper parts of the warp 100, thus resulting in fixation of the warp 100. That is, the warp 100 and weft 200 may be woven to form a textile digital band 1000 in accordance with one embodiment of the present invention.

As described above, the textile digital band 1000 is formed by weaving a plurality of warps 100 formed in the first direction and a plurality of wefts 200 formed in the second direction, and the warp 100 includes at least one digital yarn 120. Further, common warps 110 are positioned at the edges of the warps 100. Therefore, the textile digital band 1000 can be easily sewed to a conventional garment by sewing the common warps 110 positioned at the edges of the warps 100. As a result, the textile digital band 1000 can provide a high-speed communication path with surrounding computing devices through easy attachment of the digital band 1000 to a conventional garment.

Hereinafter, a textile digital band (not shown) in accordance with another embodiment of the present invention will be illustrated.

Figure 8:
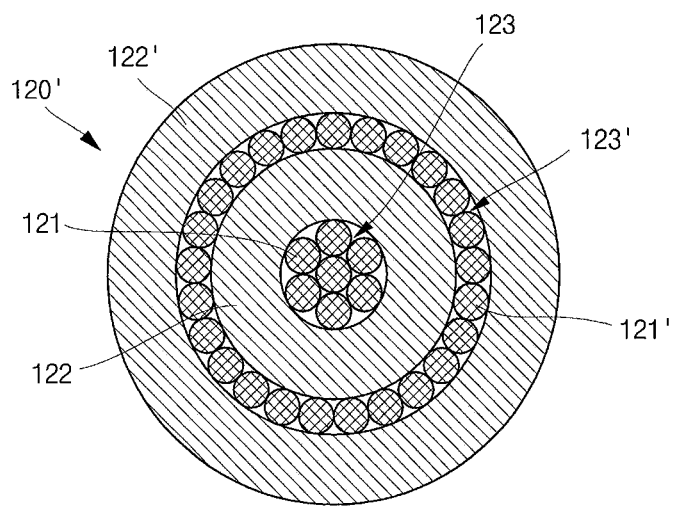
FIG. 8 is an enlarged cross-sectional view of digital yarn used in a textile digital band in accordance with another embodiment of the present invention.

FIG. 8 is an enlarged cross-sectional view of digital yarn used in a textile digital band in accordance with another embodiment of the present invention.

Although not shown in FIG. 8, the textile digital band in accordance with another embodiment of the present invention except for the configuration of the digital yarn 120' is the same as the digital band 1000 as described hereinbefore. Like numbers refer to like elements in previously described figures, Hereinafter, differences will be mainly illustrated.

As shown in FIG. 8, a digital yarn 120' used in the textile digital band in accordance with another embodiment of the present invention includes a plurality of outer metal parts 121' arranged along an outer periphery of the coating portion 122 and an outer coating portion 122' formed surrounding the outer periphery of the outer metal parts 121', in addition to the metal part 121 and the coating portion 122.

Further, voids 123 may be formed between the metal parts 121 and the coating portion 122, and voids 123' may also be formed between the coating portion 122, the outer metal parts 121' and the outer coating portion 122'.

The outer metal parts 121' are arranged at equal spacing along the outer periphery of the coating portion 122. Further, the outer metal parts 121' may be compactly arranged to surround the coating portion 122.

The outer metal parts 121' prevent penetration of electromagnetic waves coming from the metal parts 121 into the human body, and also blocks penetration of external electromagnetic wave noise into the metal parts 121. The outer metal parts 121' are formed of the same material as the metal parts 121, are arranged outside the metal parts 121, and have a sectional area larger than the metal parts 121. Therefore, the outer metal parts 121' can easily absorb electromagnetic wave noise. As a consequence, the outer metal parts 121' can further improve electromagnetic wave-shielding effects of the coating portion 122.

The outer coating portion 122' is formed to surround the outer metal parts 121'. The outer coating portion 122' is formed of the same material as the coating portion 122 and serves to block electromagnetic waves coming from the metal part 121 and electromagnetic wave noise from the external source.

As described above, the textile digital band in accordance with another embodiment of the present invention can more effectively prevent the penetration of electromagnetic waves from the metal parts 121 into the human body, and the penetration of external noise into the metal parts 121, through further provision of the outer metal parts 121' and the outer coating portion 122' outside the metal parts 121 and the coating portion 122.

Hereinafter, a method for fabricating a textile digital band 1000 in accordance with one embodiment of the present invention will be illustrated.

Figure 9:
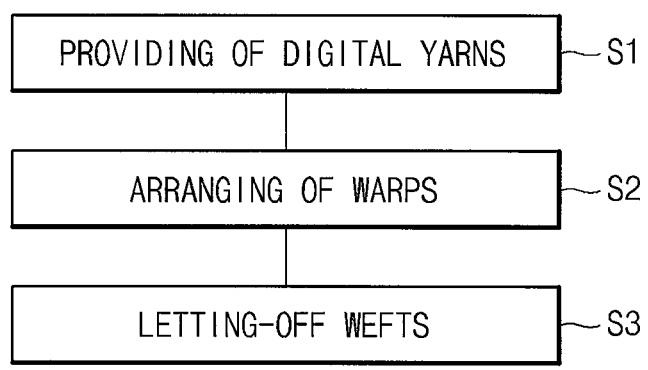
FIG. 9 is a flow chart illustrating a method for fabricating a textile digital band in accordance with one embodiment of the present invention.

FIG. 9 is a flow chart illustrating a method for fabricating a textile digital band 1000 in accordance with one embodiment of the present invention.

Referring to FIG. 9, the method for fabricating the textile digital band 1000 in accordance with one embodiment of the present invention comprises providing of digital yarns (S1), arranging of warps (S2), and letting-off of wefts (S3). Hereinafter, individual steps of FIG. 9 necessary for fabrication of the textile digital band 1000 will be illustrated with reference to FIG. 1 to FIG. 4 and FIG. 6 and FIG. 7.

Providing of digital yarns (S1) is a step of preparing digital yarns 120 used in the warp 100 of the textile digital band 1000 in accordance with one embodiment of the present invention.

Providing of digital yarns (S1) first includes preparing of a metal part 121 having a first metal part 121*a* and a second metal part 121*b*. The metal part 121 may further include a third metal part 121*c* outside the second metal part 121*a*. Since the metal part 121 is first fabricated in the form of a metal bar, processing of the metal bar into a desired shape of the metal part 121 may sequentially include drawing, softening and winding steps of the bar. Details associated with preparation of the metal part will be omitted herein.

Next, providing of digital yarns (S1) includes providing of a coating portion 122 coated on an outer periphery of the metal part 121. The coating portion 122 prevents penetration of electromagnetic waves generated from the textile digital band 1000 into the human body and simultaneously prevents penetration of external noise into the metal part 121. Examples of the material for the coating portion 122 may include, but are not limited to, ethylenetetrafluoroethylene (ETFE), fluorinated ethylene propylene (FEP), polytetrafluoroethylene (PTFE), polyvinylidene fluoride (PVDF), perfluoroalkoxy (PFA) and functional equivalents thereof. Further, formation of the coating portion 122 may be followed by an additional process including drying.

Additionally, the providing step of the digital yarns (S1) may further include covering the outer periphery of the coating portion 122 with the cover yarns 124. The cover yarns 124 may be made of yarn. The cover yarns 124 buffer impact applied when the digital yarns 120 undergo repeated bending, which consequently prevents breakage of metal part 121 and coating portion 122 inside the digital yarns 120.

Thereafter, the warp arranging step (S2) follows which includes formation of warps 100 parallel to each other along the first direction and arrangement of warps 100 at equal spacing in the second direction perpendicular to the first direction. The warps 100 include a plurality of common warps 110 and the digital yarns 120. Further, the common warps 110 are arranged in edges of the warps 100, and the common warps 110 and at least one digital yarn 120 are arranged inside edges of the warps 100.

Next, the weft letting-off step (S3) is carried out which is allowed to let-off a plurality of wefts 200 such that they are arranged perpendicularly to the warps 100. The wefts 200 include first wefts 210 and second wefts 220, which are adjacent to each other depending on the rows where they are formed. The first wefts 210 and second wefts 220 are let-off to ensure that they pass in a zigzag fashion between the warps 100. Further, upon viewing from the plane which is defined by the warps 100, the direction where the first wefts 210 pass between the warps 100 is opposite to the direction where the second wefts 220 pass between the warps 110.

As such, the textile digital band 1000 in accordance with one embodiment of the present invention can be fabricated. Further, after further formation of the outer metal part 221 and the outer coating portion 222 outside the metal part 121 and the coating portion 122 during the step of providing the digital yarns (S1), arranging of warps (S2) and letting-off of wefts (S3) may be sequentially carried out to prepare the digital band in accordance with another embodiment of the present invention.

The invention claimed is:

1. A textile digital band comprising:
a plurality of warps formed parallel to each other in the first direction; and
a plurality of wefts formed parallel to each other in the second direction perpendicular to the first direction,
wherein the warp includes at least one digital yarn through which electrical currents can flow, the digital yarn comprising:
 a plurality of metal parts positioned at the center of the digital yarn based on a diameter thereof and providing a communication path;
 a coating portion formed surrounding the metal parts and shielding electromagnetic waves;
 a plurality of outer metal parts arranged along an outer periphery of the coating portion, wherein the outer metal parts are 100% metal;
 an outer coating portion formed surrounding the outer metal parts, wherein outer voids are formed in spaces between the outer metal parts and the outer coating portion; and
 a plurality of cover yarns independently arranged along the first direction to form a periphery of the digital yarns.

2. The textile digital band according to claim 1, wherein the warps include:

a plurality of common warps formed parallel to each other in the first direction and consisting of single yarns or ply yarns; and the digital yarns formed between the common warps.

3. The textile digital band according to claim 1, wherein the metal parts and the outer metal parts are formed of at least one selected from the group consisting of copper, copper alloy, silver, silver alloy, gold, gold alloy, brass and any combination thereof.

4. The textile digital band according to claim 1, wherein the metal parts includes:

a first metal part positioned at the center of the metal parts based on a diameter thereof and formed along the first direction; and a second metal part formed surrounding the outside of the first metal part.

5. The textile digital band according to claim 4, wherein the first metal part and the second metal part are formed of different materials.

6. The textile digital band according to claim 5, wherein the outside of the second metal part is further provided with a third metal part formed surrounding the second metal part.

7. The textile digital band according to claim 6, wherein the third metal part is formed of a metal material different from that of the second metal part.

8. The textile digital band according to claim 1, wherein voids are formed in spaces between the metal parts and the coating portion.

9. The textile digital band according to claim 1, wherein the coating portion comprises a material selected from the group consisting of ethylene tetrafluoroethylene (ETFE), fluorinated ethylene propylene (FEP), polytetrafluoroethylene (PTFE), polyvinylidene fluoride (PVDF) and perfluroalkoxy (PFA).

* * * * *